United States Patent
Hennessy et al.

(10) Patent No.: US 6,784,434 B2
(45) Date of Patent: Aug. 31, 2004

(54) IMAGING ARRAY AND METHOD FOR MANUFACTURING SAME

(75) Inventors: William Andrew Hennessy, Rexford, NY (US); Douglas Albagli, Clifton Park, NY (US); Ji Ung Lee, Niskayuna, NY (US); Ching-Yeu Wei, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 189 days.

(21) Appl. No.: 10/183,904

(22) Filed: Jun. 25, 2002

(65) Prior Publication Data

US 2003/0234364 A1 Dec. 25, 2003

(51) Int. Cl.[7] .................................. G01T 1/24
(52) U.S. Cl. ........................ 250/370.14; 250/370.08; 438/57; 257/428
(58) Field of Search ................. 250/370.14, 370.08, 250/370.09; 438/57; 257/428

(56) References Cited

U.S. PATENT DOCUMENTS

| | | | | |
|---|---|---|---|---|
| 5,198,673 A | * | 3/1993 | Rougeot et al. | 250/370.11 |
| 5,399,884 A | | 3/1995 | Wei et al. | |
| 5,435,608 A | | 7/1995 | Wei et al. | |
| 5,480,810 A | | 1/1996 | Wei et al. | |
| 5,838,054 A | | 11/1998 | Kwasnick et al. | |
| 6,462,344 B1 | * | 10/2002 | Joo et al. | 250/370.09 |
| 6,617,584 B2 | * | 9/2003 | Choo et al. | 250/370.01 |
| 2001/0013577 A1 | * | 8/2001 | Choo et al. | 250/370.09 |
| 2002/0145117 A1 | * | 10/2002 | Mochizuki | 250/370.09 |
| 2003/0080299 A1 | * | 5/2003 | Moon | 250/370.09 |
| 2003/0201396 A1 | * | 10/2003 | Lee | 250/370.09 |

* cited by examiner

Primary Examiner—Albert Gagliardi
(74) Attorney, Agent, or Firm—Armstrong Teasdale LLP

(57) ABSTRACT

A method for fabricating a radiation detector including at least one Thin Film Transistor (TFT) includes forming a low resistance data line strap unitary with a light block element on the TFT.

18 Claims, 5 Drawing Sheets

IMAGING ARRAY AND METHOD FOR MANUFACTURING SAME

BACKGROUND OF THE INVENTION

This invention relates generally to thin film semiconductor X-Ray imaging arrays, and more particularly, to fabricating such an imaging array with a reduced data line resistance while simultaneously providing a thin film transistor (TFT) light blocking element.

Indirect thin film semiconductor imaging arrays typically include a photosensor array coupled to a scintillating medium. Radiation absorbed in the scintillator generates optical photons which in turn pass into a photosensor, such as a photodiode. The optical photon is absorbed in the photosensor and an electrical charge corresponding to an incident photon flux is generated. Substantially hydrogenated amorphous silicon ($\alpha$-Si) is commonly used in the fabrication of photosensors due to the advantageous photoelectric characteristics of $\alpha$-Si and the relative ease of fabricating such devices, especially for large area format devices. In particular, photosensitive elements, such as photodiodes, can be formed in connection with necessary control or switching elements, such as bottom-gated thin film transistors (TFTs), in a relatively large array. Radiation detectors and display arrays are typically fabricated on a large substrate on which many components, including TFTs, address lines, capacitors, and photosensors are formed through the sequential deposition and patterning of layers of conductive, semiconductive, and insulative materials.

At least one known fabrication process for such an X-Ray imaging array typically includes fabricating the TFT and then the photodiode. Fabricating a typical bottom-gated TFT includes the deposition and patterning of a metal layer to form the gate electrodes. A gate dielectric layer is then deposited over the gate electrode followed by the deposition and patterning of a layer of semiconductive material (typically, $\alpha$-Si). Various address lines are subsequently formed as the source/drain (data line) electrode layer is deposited, and patterned. The TFT array is then coated with a dielectric passivation layer prior to the fabrication of the photodiode active matrix. This dielectric layer is subsequently patterned to form contact windows to the underlying source/drain metallization. An $\alpha$-Si photodiode layer is then deposited and patterned to form the pixilated photosensor array. At this point, an additional dielectric passivation layer is deposited and patterned with a plurality of vias to provide interconnection to the TFT, diode, and other device elements. A final layer of metallization is deposited and etched to provide the appropriate electrical interconnection to the underlying device elements.

Overall system performance is improved as the system noise is decreased. The data line noise contribution to overall system noise is proportional to the square root of the data line series resistance. Thus, improved detector performance can be achieved by minimizing the electrical series resistance of the individual array data lines.

Illumination of the TFT by X-ray generated optical photons from the scintillator layer can induce OEFL (Optically Enhanced TFT Leakage). As the TFT leakage increases, the behavior of the associated pixel becomes non-linear and an erroneous signal is generated on other pixels connected to the same dataline which results in the formation of image artifacts. High levels of OEFL can therefore degrade overall detector performance.

In one known array formation process, several additional deposition and patterning steps, compared to the process described above in [0003], are required to achieve a reduction in data line series resistance and to form a light blocking shield over the TFT region. Each deposition and patterning step, involving photomasking and etching, increases detector fabrication costs as well as the likelihood of detector yield loss due to inadvertent damage to the active matrix array.

BRIEF DESCRIPTION OF THE INVENTION

In one aspect, a method for fabricating a radiation detector including at least one Thin Film Transistor (TFT) is provided. The method includes forming a low resistance data line strap unitary with a light block element on the TFT.

In another aspect, a method for fabricating a radiation detector is provided. The method includes providing a thin film transistor (TFT), depositing a dielectric layer on the TFT, forming an opening for a data line strap via in the dielectric layer, and forming the data line strap via in the opening such that a data line strap is electrically coupled to a data line and the data line strap is unitary with a light block element.

In another aspect a radiation detector is provided. The radiation detector includes a thin film transistor (TFT) and a data line strap unitary with a light block element on the TFT.

In another aspect, a radiation detector is provided. The radiation detector includes a thin film transistor (TFT), a dielectric layer deposited on the TFT, an opening for a data line strap via in the dielectric layer, and a data line strap via in the opening such that the data line strap is electrically coupled to a data line and such that the data line strap is unitary with a light block element on the TFT.

DETAILED DESCRIPTION OF THE INVENTION

As used herein, "formation", "forming", and "formed" includes processes to fabricate each component of detector including, but not limited to, patterning, masking, depositing, and etching.

Patterning processes include, but are not limited to, depositing photoresist, exposing photoresist in accordance with a desired pattern, and processing the photoresist to remove portions thereof, leaving a mask having a selected pattern corresponding to desired dimensions.

Metallization is a process in which selected elements are contacted and interconnections of a plurality of circuit elements are made. During metallization, a metallic material is deposited by sputtering or is deposited by evaporating a thin layer of a metallic material over a substrate surface. Alternatively, the metallic material is deposited by a combination of sputtering and electroplating.

Figure 1:
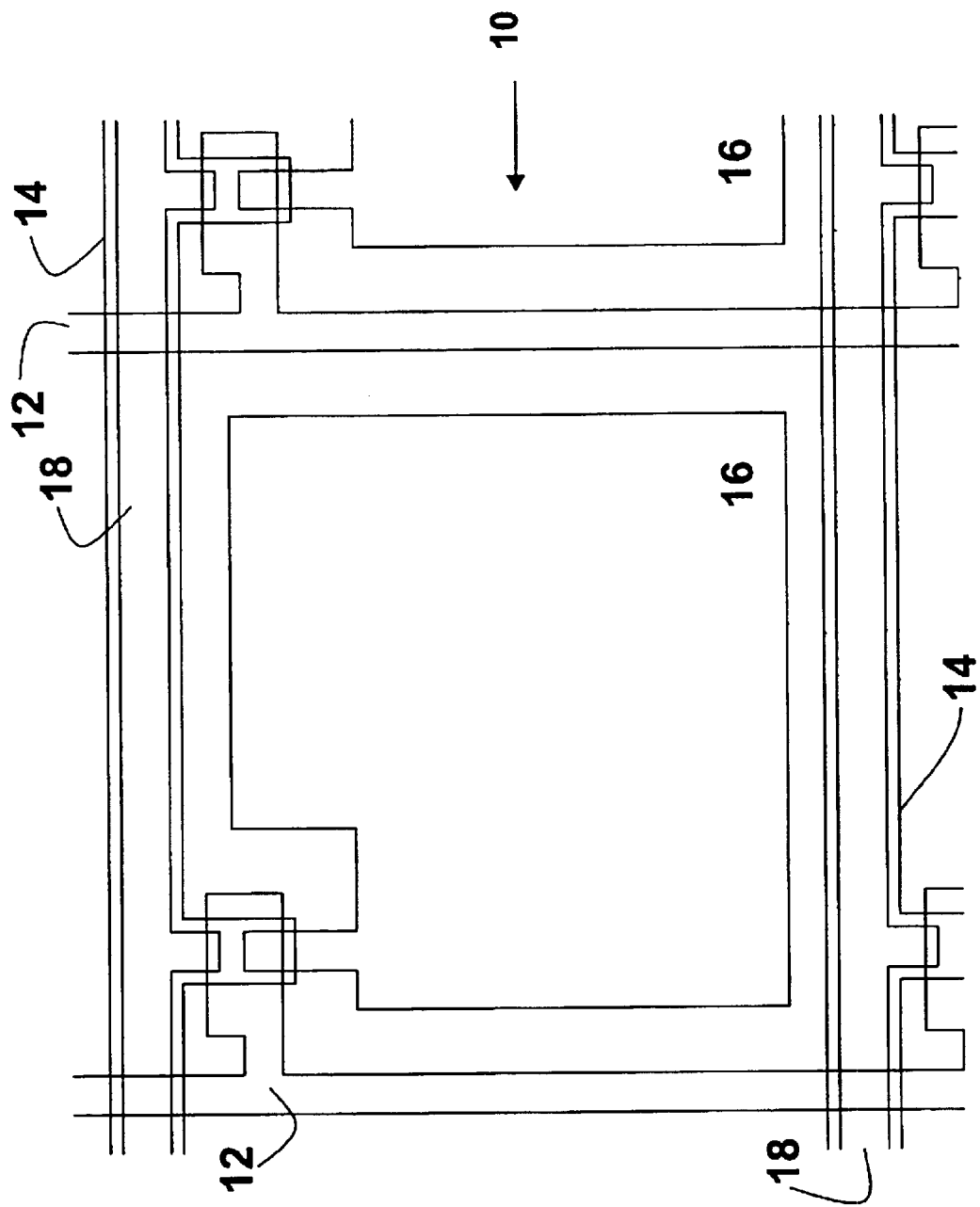
FIG. 1 is a top view of a portion of a detector array after fabrication of TFT layers.

FIG. 1 is a top view of a portion of a detector array 10 after fabrication of a plurality of TFT layers including a scan line 12, a Field Effect Transistor (FET) silicon layer 14, a diode bottom contact 16, and a data line 18.

Figure 2:
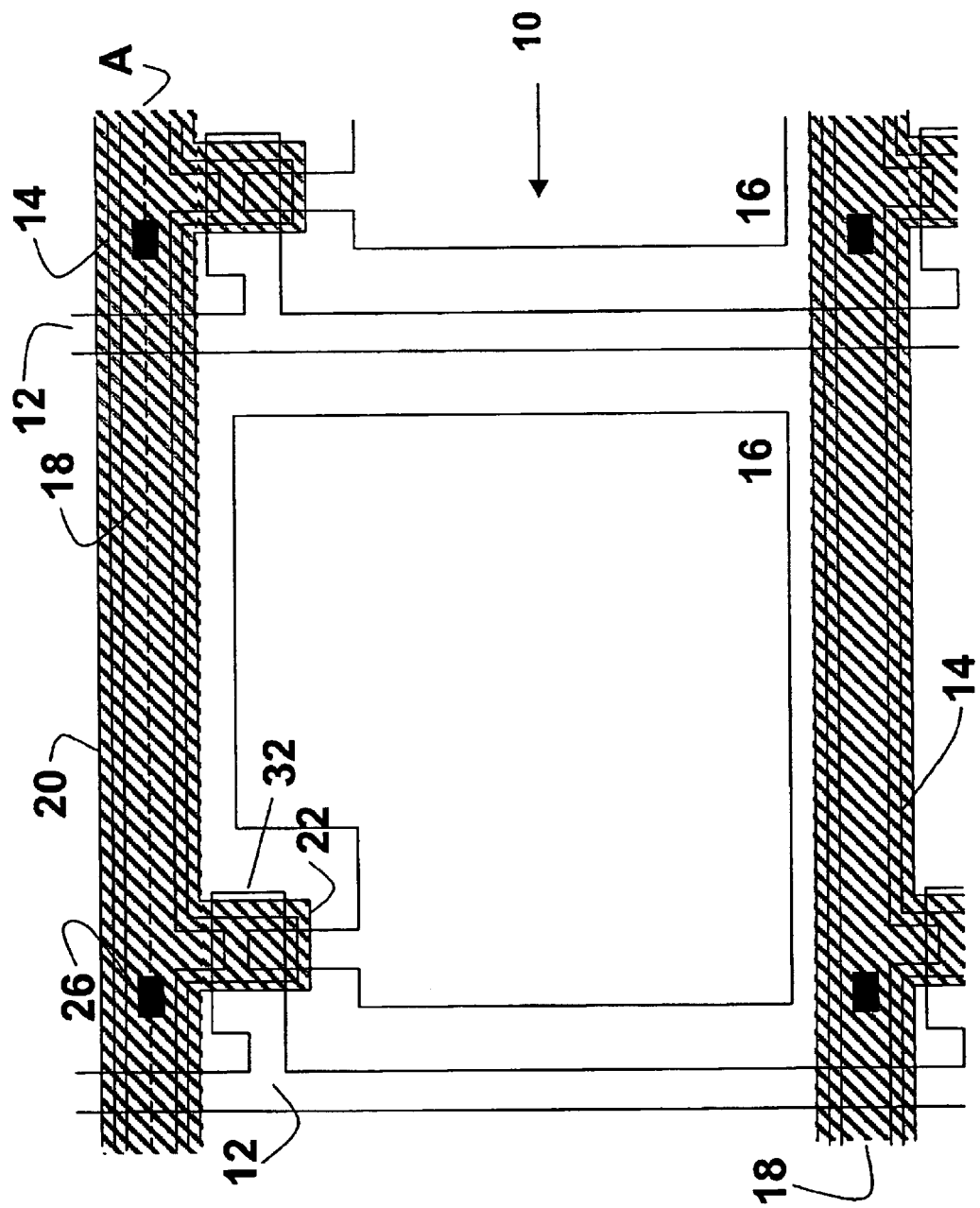
FIG. 2 is a top view of the detector array pixel including a data line strap and a TFT light block element.
Figure 3:
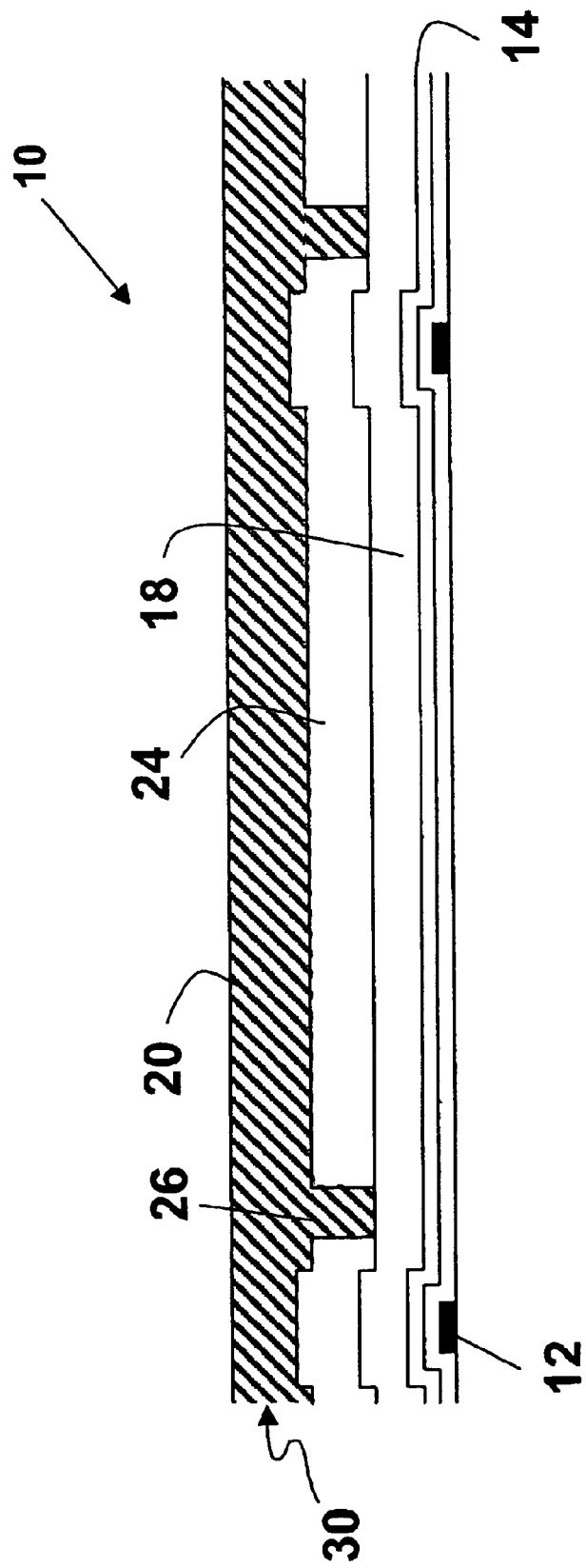
FIG. 3 is a cross-sectional view of the detector array pixel shown in FIG. 2 shown through a cross-section A.

FIG. 2 is a top view of a portion of a detector array 10 including a data line strap 20 and a TFT light block element 22. FIG. 3 is a cross-sectional view of the detector pixel illustrated in FIG. 2 shown through cross-section A. In one embodiment, data line strap 20 and TFT light block element 22 are formed immediately following fabrication of the TFT layers. A dielectric layer 24 is deposited over the entire surface of the detector following TFT fabrication. In one embodiment dielectric layer 24 is between approximately 0.25 microns ($\mu$) and approximately 1.0$\mu$ in thickness. In another embodiment, dielectric layer 24 is between approximately 0.5$\mu$ and approximately 1.25$\mu$ thick. In a further embodiment, dielectric layer 24 is approximately 0.75$\mu$ thick. Dielectric layer 24 includes, but is not limited to silicon nitride ($SiN_x$) and silicon oxide ($SiO_x$). Dielectric layer 24 is patterned and etched to form a data line strap contact via 26. Contact via 26 is formed to data line 18 by removing dielectric layer 24 from a plurality of contact via regions. Contact via 26 is formed through a combination of photolithographic and plasma or acid dielectric etch processes. Contact via 26 is surrounded on all sides by remaining portions of dielectric layer 24 such that electrical contact can subsequently be made to underlying data line metallization 18. In one embodiment, each contact via 26 is approximately 3$\mu$ in length and approximately 3$\mu$ in width. Contact via 26 is designed to provide a contact density ratio (i.e. vias/pixel) between approximately 0.25 and approximately 3.0.

A metallic layer 30 is deposited on dielectric layer 24 and exposed portions of data line 18 to form data line strap 20 and TFT light block element 22, such that data line strap 20 and TFT light block element 22 are fabricated unitarily. Fabricating data line strap 20 and TFT light block element 22 unitarily facilitates reducing line resistance of data line 18 while simultaneously forming an opaque TFT light blocking element 22 over the active TFT region 32. The extent to which the overall data line resistance is reduced is determined by the electrical characteristics of data line 18, the width and thickness of the data line strap 20 as well as the metal of which it is composed. For example, the overall resistance of the data line will be reduced by ~2–8X utilizing a data line 18 composed of Mo and a data line strap 20 composed of Aluminum. In an exemplary embodiment, metallic layer 30 includes an optically opaque high electrical conductivity material, and data line strap 20 and TFT light block element 22 are formed unitarily through a blanket deposition and subsequent pattern and etch steps of metallic layer 30. Further, opaque metallic layer 30 enters contact via 26 which electrically connects data line strap 20 to data line 18. Data line strap 20 and TFT light block element 22 are unitarily formed through a combination of photolithographic and plasma or acid metal etch processes. Data line strap 20 contacts data line 18 at the pixel location through data line strap contact via 26. In one embodiment, metallic layer 30 includes metals such as, but not limited to chromium, titanium, molybdenum, aluminum, silver, and copper, and is disposed in one layer or in combinations of metallic layers. In one embodiment metallic layer 30 is between approximately 0.25 microns ($\mu$) and approximately 1.25$\mu$ in thickness. In another embodiment, metallic layer 30 is between approximately 0.5$\mu$ and approximately 1.0 $\mu$thick. In a further embodiment, metallic layer 30 is approximately 0.75$\mu$ thick.

Following deposition, patterning and etch of metallic layer 30 to unitarily form data line strap 20 and TFT light block element 22, fabrication of detector 10 continues with thin film processing steps to provide subsequent device layers so as to complete formation of detector 10. For example, the deposition of a dielectric layer over data line strap 20 and light block element 22; patterning of the dielectric to form openings to diode bottom contact 16; deposition, patterning, and etch of a photodiode layer; subsequent deposition of one or more dielectric layers, patterning and etch of these dielectric layers to form openings to the photodiode and other underlying metal layers; and finally the deposition, pattern, and etch of at least one transparent or opaque metal electrode.

Figure 4:
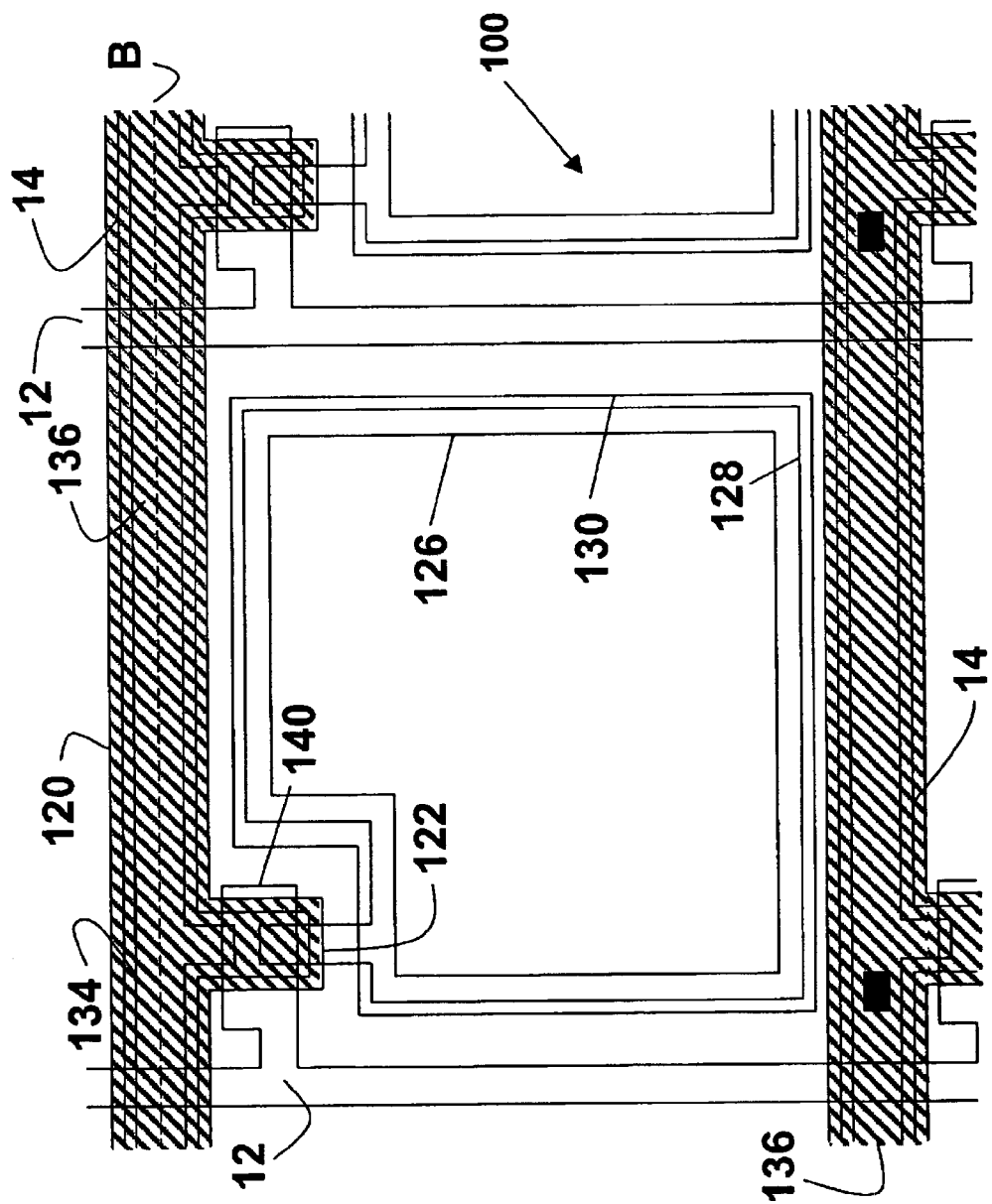
FIG. 4 is a top view of a portion of a detector array pixel including a data line strap and a TFT light block element.
Figure 5:
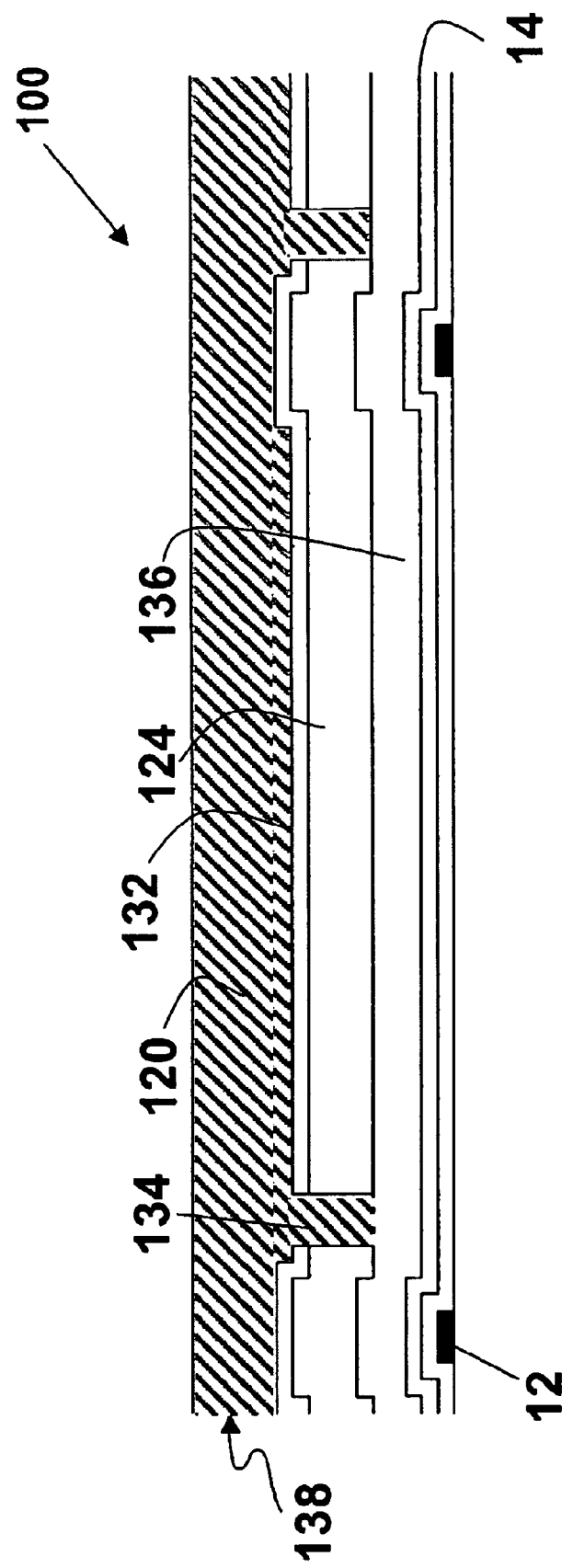
FIG. 5 is a cross-sectional view of the detector array pixel shown in FIG. 4 shown through a cross-section B.

FIG. 4 is a top view of a portion of a detector array 100 including a data line strap 120 and a TFT light block element 122. FIG. 5 is a cross-sectional view of the detector pixel illustrated in FIG. 4 shown through cross-section B. In another exemplary embodiment, a data line strap 120 and a TFT light block element 122 are formed following fabrication of the pixel photodiode element. A TFT dielectric layer 124 is deposited over the entire surface of pixel region following TFT fabrication. In one embodiment dielectric layer 124 is between approximately 0.25 microns ($\mu$) and approximately 1.0$\mu$ in thickness. In another embodiment, dielectric layer 124 is between approximately 0.5$\mu$ and approximately 1.25$\mu$ thick. In a further embodiment, dielectric layer 124 is approximately 0.75$\mu$ thick. Dielectric layer 124 includes, but is not limited to, silicon nitride ($SiN_x$) and silicon oxide ($SiO_x$). Dielectric layer 124 is patterned and etched to form a diode bottom contact aperture 126. Diode bottom contact aperture 126 is formed to an existing diode bottom metallization pad 128 by removing dielectric layer 124 from the diode bottom contact regions. Contact aperture 126 is formed through a combination of photolithographic and plasma or acid dielectric etch processes. Contact aperture 126 is surrounded on all sides by remaining portions of dielectric layer 124 such that electrical contact can subsequently be made to underlying diode bottom contact metallization 128.

Following completion of diode bottom contact aperture 126, layers of semiconducting films are deposited, patterned, and etched to form photodiode 130.

A dielectric layer 132 is deposited over the entire surface of the detector region. In one embodiment dielectric layer 132 is between approximately 0.25 microns ($\mu$) and approximately 1.0$\mu$ in thickness. In another embodiment, dielectric layer 132 is between approximately 0.5$\mu$ and approximately 1.25$\mu$ thick. In a further embodiment, dielectric layer 132 is approximately 0.75$\mu$ thick. Dielectric layer 132 includes, but is not limited to silicon nitride ($SiN_x$) and silicon oxide ($SiO_x$). Dielectric layer 132 is patterned and etched to form a data line strap contact via 134. Contact via 134 is formed to a data line 136 by removing passivation layer 124 and dielectric layer 132 from the contact via regions. Contact via 134 is formed through a combination of photolithographic and plasma or acid dielectric etch processes. Contact via 134 is surrounded on all sides by remaining portions of passivation layer 124 and dielectric layer 132 such that electrical contact can subsequently be made to underlying data line metallization 136. In one embodiment, each contact via 134 is approximately 3$\mu$ in length and approximately 3$\mu$ in width. Contact via 134 is designed to provide a contact density ratio (i.e. vias/pixel) between approximately 0.25 and approximately 3.0.

A metallic layer 138 is deposited on dielectric layer 132 and exposed portions of data line 136 to form data line strap 120 and TFT light block element 122, such that data line strap 120 and TFT light block element 122 are fabricated unitarily. Fabricating data line strap 120 and TFT light block element 122 unitarily facilitates reducing the line resistance of data line 136 and while simultaneously forming an opaque TFT light block element 122 over the active TFT region. In an exemplary embodiment, metallic layer 138 includes an optically opaque high electrical conductivity material, and data line strap 120 and TFT light block element 122 are formed unitarily through a blanket deposition and subsequent pattern and etch steps of metallic layer 138. Further, opaque metallic layer 138 enters data line strap contact via 134 which electrically connects data line strap 120 to data line 136. Data line strap 120 and TFT light block element 122 are unitarily formed through a combination of photolithographic and plasma or acid metal etch processes. Data line strap 120 contacts data line 136 at the pixel location through data line strap via 134. In one embodiment, metallic layer 138 includes metals such as, but not limited to chromium, titanium, molybdenum, aluminum, silver, and copper, and is disposed in one layer or in combinations of metallic layers. In one embodiment metallic layer 138 is between approximately 0.25 microns ($\mu$) and approximately 1.25$\mu$ in thickness. In another embodiment, metallic layer 138 is between approximately 0.5$\mu$ and approximately 1.0$\mu$ thick. In a further embodiment, metallic layer 138 is approximately 0.75$\mu$ thick.

Following deposition, patterning and etch of metallic layer 138 to unitarily form data line strap 120 and TFT light block element 122, fabrication of detector 10 continues with thin film processing steps to provide subsequent device layers so as to complete formation of detector 10. For example, the deposition of a dielectric layer over data line strap 120 and light block element 122; patterning of this dielectric to form openings to the photodiode and other underlying metal layers; and finally the deposition, pattern, and etch of at least one transparent or opaque metal electrode.

As described herein, both embodiments facilitate providing a low resistance data line and a TFT light blocking element with a minimal number of thin film depositions, photolithography, and pattern etch steps. By using the same metallization to simultaneously form the data line strap and the TFT light blocking element, overall detector performance is improved with a minimized level of process complexity. Rather than using separate metallization layers to shunt the data line and form the TFT light blocking element, both embodiments of this invention provide a means to achieve these device features using a single metallization layer and a reduced number of fabrication steps. In the fabrication of solid state imagers, the reduction in the number of fabrication steps generally increases yield of the fabrication process therefore reducing the manufacturing costs of such devices.

While the invention has been described in terms of various specific embodiments, those skilled in the art will recognize that the invention can be practiced with modification within the spirit and scope of the claims.

What is claimed is:

1. A method for fabricating a radiation detector including at least one Thin Film Transistor (TFT), said method comprising:
   forming a low resistance data line strap unitary with a light block element on the TFT.

2. A method in accordance with claim 1 further comprising:
   depositing a dielectric layer on the detector;
   forming an opening for a data line strap via in the dielectric layer; and
   forming a data line strap via in the opening such that the data line strap is electrically coupled to a data line.

3. A method in accordance with claim 2 wherein the dielectric layer comprises at least one of a silicon nitride and a silicon oxide material.

4. A method in accordance with claim 1 wherein forming a data line strap with light blocking material further comprises forming the data line strap with an optically opaque metal.

5. A method in accordance with claim 4 wherein the metal comprises at least one of a molybdenum, a chromium, a silver, a copper, and an aluminum material.

6. A method in accordance with claim 4 wherein forming a data line strap with light blocking material further comprises forming a data line strap approximately 0.75$\mu$ thick.

7. A method in accordance with claim 1 wherein forming a data line strap unitary with a light block element on the TFT further comprises forming a data line strap unitary with a light block element on the TFT in a single metallization.

8. A method in accordance with claim 1 wherein depositing the dielectric layer comprises depositing a dielectric layer that is approximately 0.5$\mu$ thick.

9. A method for fabricating a radiation detector, said method comprising:
   providing a thin film transistor (TFT);
   depositing a dielectric layer on the TFT;
   forming an opening for a data line strap via in the dielectric layer; and
   forming the data line strap via in the opening such that a data line strap is electrically coupled to a data line and the data line strap is unitary with a light block element.

10. A radiation detector comprising:
    a thin film transistor (TFT); and
    a data line strap unitary with a light block element on said TFT.

11. A radiation detector in accordance with claim 10 further comprising:
    a dielectric layer deposited on said detector;
    an opening for a data line strap via in said dielectric layer; and
    a data line strap via in said opening such that said data line strap is electrically coupled to a data line.

12. A radiation detector in accordance with claim 11 wherein said dielectric layer comprises at least one of a silicon nitride and a silicon oxide material.

13. A radiation detector in accordance with claim 10 wherein said data line strap comprises an opaque metal.

14. A radiation detector in accordance with claim 13 wherein said metal comprises at least one of a molybdenum, a chromium, a silver, a copper, and an aluminum material.

15. A radiation detector in accordance with claim 13 wherein said data line strap is approximately 0.75$\mu$ thick.

16. A radiation detector in accordance with claim 10 wherein said data line strap and said light block element are formed in a single metallization.

17. A radiation detector in accordance with claim 10 wherein said dielectric layer is approximately 0.5$\mu$ thick.

18. A radiation detector comprising:
    a thin film transistor (TFT);
    a dielectric layer deposited on said TFT;
    an opening for a data line strap via in said dielectric layer; and
    a data line strap via in said opening such that a data line strap is electrically coupled to a data line and such that said data line strap is unitary with a light block element on said TFT.

* * * * *